United States Patent
Shimbo

(10) Patent No.: US 9,748,237 B2
(45) Date of Patent: Aug. 29, 2017

(54) SEMICONDUCTOR INTEGRATED CIRCUIT AND LOGIC CIRCUIT

(71) Applicant: SOCIONEXT INC., Yokohama-shi, Kanagawa (JP)

(72) Inventor: Hiroyuki Shimbo, Kyoto (JP)

(73) Assignee: Socionext, Inc., Kanagawa (JP)

( * ) Notice: Subject to any disclaimer, the term of this patent is extended or adjusted under 35 U.S.C. 154(b) by 0 days.

(21) Appl. No.: 15/079,987

(22) Filed: Mar. 24, 2016

(65) Prior Publication Data

US 2016/0204107 A1 Jul. 14, 2016

Related U.S. Application Data

(63) Continuation of application No. PCT/JP2014/004516, filed on Sep. 3, 2014.

(30) Foreign Application Priority Data

Sep. 27, 2013 (JP) ................. 2013-201061

(51) Int. Cl.
| | | |
|---|---|---|
| *H03K 19/00* | (2006.01) | |
| *H01L 27/088* | (2006.01) | |
| *H01L 21/8234* | (2006.01) | |
| *H01L 29/66* | (2006.01) | |

(52) U.S. Cl.
CPC .. *H01L 27/0886* (2013.01); *H01L 21/823431* (2013.01); *H01L 29/6681* (2013.01); *H03K 19/0013* (2013.01)

(58) Field of Classification Search
None
See application file for complete search history.

(56) References Cited

U.S. PATENT DOCUMENTS

| 2010/0237436 A1 | 9/2010 | Inaba | |
|---|---|---|---|
| 2013/0027083 A1 | 1/2013 | Ando et al. | |
| 2014/0077303 A1* | 3/2014 | Baek | G06F 17/5063 257/365 |
| 2014/0197463 A1* | 7/2014 | Gan | H01L 27/11807 257/204 |

(Continued)

FOREIGN PATENT DOCUMENTS

| JP | 06-045565 A | 2/1994 |
|---|---|---|
| JP | 06-085064 A | 3/1994 |

(Continued)

OTHER PUBLICATIONS

International Search Report issued in Application No. PCT/JP2014/004516 dated Dec. 2, 2014, with English translation.

*Primary Examiner* — Jany Richardson
(74) *Attorney, Agent, or Firm* — McDermott Will & Emery LLP

(57) ABSTRACT

Disclosed herein is a driver circuit including first and second n-channel transistors connected together in series between first and second nodes. The first n-channel transistor is comprised of n fin transistor(s) having an identical gate length and an identical gate width where n is equal to or greater than one, and has its gate connected to a first input node. The second n-channel transistor is comprised of m fin transistors having the same gate length and the same gate width where m is greater than n, and has its gate connected to a second input node.

12 Claims, 5 Drawing Sheets

(56) References Cited

U.S. PATENT DOCUMENTS

| | | | |
|---|---|---|---|
| 2014/0239255 A1* | 8/2014 | Kang | H01L 29/775 257/24 |
| 2014/0264628 A1* | 9/2014 | Lin | H01L 27/0808 257/401 |

FOREIGN PATENT DOCUMENTS

| | | |
|---|---|---|
| JP | 09-027554 A | 1/1997 |
| JP | 09-289251 A | 11/1997 |
| JP | 2009-193981 A | 8/2009 |
| JP | 2010-225768 A | 10/2010 |
| JP | 2013-030602 A | 2/2013 |

* cited by examiner

SEMICONDUCTOR INTEGRATED CIRCUIT AND LOGIC CIRCUIT

CROSS-REFERENCE TO RELATED APPLICATIONS

This is a continuation of International Application No. PCT/JP2014/00416 filed on Sep. 3, 2014, which claims priority to Japanese Patent Application No. 2013-201061 filed on Sep. 27, 2013. The entire disclosures of these applications are hereby incorporated by reference.

BACKGROUND

The present disclosure relates to a semiconductor integrated circuit including a transistor having a fin structure, and a logic circuit including such a semiconductor integrated circuit.

It is known in the art that when a semiconductor integrated circuit is designed, the drivability of a transistor is controllable by adjusting the gate width or length of the transistor or changing the number of transistors connected in parallel to the transistor.

Japanese Unexamined Patent Application Publication No. H09-27554 discloses a semiconductor electronic circuit designed such that its drivability is controllable by arranging a plurality of transistors having different gate lengths and widths, selecting some transistors from these transistors depending on the necessity, and connecting such selected transistors together.

Recently, it has been proposed to utilize transistors with a fin structure (hereinafter referred to as "fin transistors") in the field of semiconductor devices. FIG. 6 schematically illustrates a fin transistor. Unlike a metal oxide semiconductor (MOS) transistor having a two-dimensional structure, its source and drain have a raised, three-dimensional structure called a "fin." Its gate is disposed so as to wrap around a channel region defined between the source and drain in this fin. In this fin structure, the channel region is defined by three surfaces of the fin, thereby improving channel controllability significantly compared to conventional ones. As a result, various advantages, including reducing the leakage power, increasing the ON-state current, and lowering the operating voltage, are achieved. This leads to improving the performance of the semiconductor integrated circuit.

SUMMARY

In a semiconductor fine patterning process, the uniformity in characteristics and the yield of devices to be fabricated are significantly affected by, e.g., the shape of the gate or diffusion layer of a transistor and the shape of its wiring pattern. Among other things, fin transistors have their characteristics significantly affected by the width of their fins. It is thus recommended to design the circuit with fin transistors having uniform gate width and length.

On the other hand, if a semiconductor integrated circuit is designed such that transistors have a fixed gate width and a fixed gate length, the number of the transistors connected together in series or in parallel may be increased or decreased, for example, to increase or decrease the drivability of the transistors. However, the possible drivability value of the transistors in such a case is limited to discrete values such as a value obtained by an integral multiplication of the number of transistors having the minimum drivability. As a result, this disadvantageously decreases the degree of flexibility in designing the circuit, and may eventually cause a decline in the performance of the circuit.

In view of the foregoing background, it is therefore an object of the present disclosure to provide a technique for easily controlling the drivability of a semiconductor integrated circuit including fin transistors to any desired level.

A first aspect of the present disclosure provides a semiconductor integrated circuit connected to first and second input nodes and first and second nodes. The circuit includes first and second transistors of a first channel type connected together in series between the first and second nodes. The first transistor is comprised of n fin transistor(s) where n is an integer equal to or greater than one. The n transistor(s) have an identical gate length and an identical gate width. The first transistor has its gate connected to the first input node. The second transistor is comprised of m fin transistors where m is an integer greater than n. The m transistors have the same gate length and the same gate width as the n fin transistors. The second transistor has its gate connected to the second input node.

A second aspect of the present disclosure provides a logic circuit including a plurality of semiconductor integrated circuits. The plurality of semiconductor integrated circuits include a first semiconductor integrated circuit configured as the semiconductor integrated circuit of the first aspect.

According to the first aspect, the semiconductor integrated circuit includes a first transistor comprised of n fin transistor(s), and a second transistor comprised of m fin transistors (where in >n), the first and second transistors being connected together in series. Setting the number of the fin transistor(s) forming the first transistor and that of the fin transistors forming the second transistor to be different from each other allows for providing a driver circuit with different drivability from a driver circuit where transistors comprised of the same number of the fin transistors are connected together in series. Accordingly, changing the number of the fin transistors forming at least one of the first and second transistors allows for providing a semiconductor integrated circuit with a desired degree of drivability. That is to say, the degree of flexibility in designing the circuit may be increased. Consequently, this allows for improving the performance of the semiconductor integrated circuit and a logic circuit including the semiconductor integrated circuit.

The present disclosure allows a semiconductor integrated circuit, including a number of transistors connected together in series, to have a desired degree of drivability by forming at least one of the transistors of a different number of fin transistors from the other transistors.

DETAILED DESCRIPTION

Embodiments of the present disclosure will now be described in detail with reference to the accompanying drawings. Note that description of any element performing substantially the same function as its counterpart already described may be omitted herein to avoid redundancies.

Also, in this specification, a fin which forms part of a transistor contributing to a logical function of a logic circuit will be hereinafter referred to as an "active fin," and a fin other than such a fin as a "dummy fin."

Figure 1:
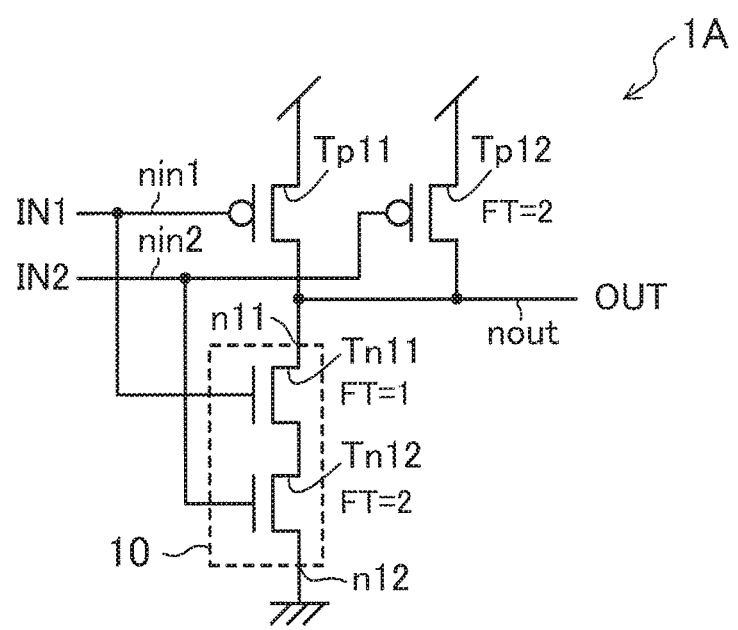
FIG. 1 conceptually illustrates an exemplary circuit configuration of a logic circuit according to an embodiment.

FIG. 1 conceptually illustrates an exemplary circuit configuration of a logic circuit 1A according to an embodiment.

As illustrated in FIG. 1, the logic circuit 1A is a two-input NAND circuit including a driver circuit 10 functioning as a semiconductor integrated circuit, and two p-channel transistors Tp11 and Tp12.

The driver circuit 10 includes n-channel transistors Tn11 and Tn12 connected together in series between a node n11 (corresponding to a first node) connected to an output node nout and a node n12 (corresponding to a second node) connected to the ground. The n-channel transistors Tn11 and Tn12 function as first and second transistors.

The n-channel transistor Tn11 is comprised of a single fin transistor which will be discussed below (and is indicated as "FT=1" in FIG. 1; the same will apply to the other transistors). The gate of the n-channel transistor Tn11 is connected to an input node nin1. Likewise, the n-channel transistor Tn12 is comprised of two fin transistors which will be discussed below. The gate of the n-channel transistor Tn12 is connected to an input node nin2.

The two p-channel transistors Tp11 and Tp12 are provided in parallel with each other between a power supply and the output node nout, and are each comprised of two fin transistors which will be described later. The gate of the p-channel transistor Tp11 is connected to the input node nin1. The gate of the p-channel transistor Tp12 is connected to the input node nin2.

Figure 2:
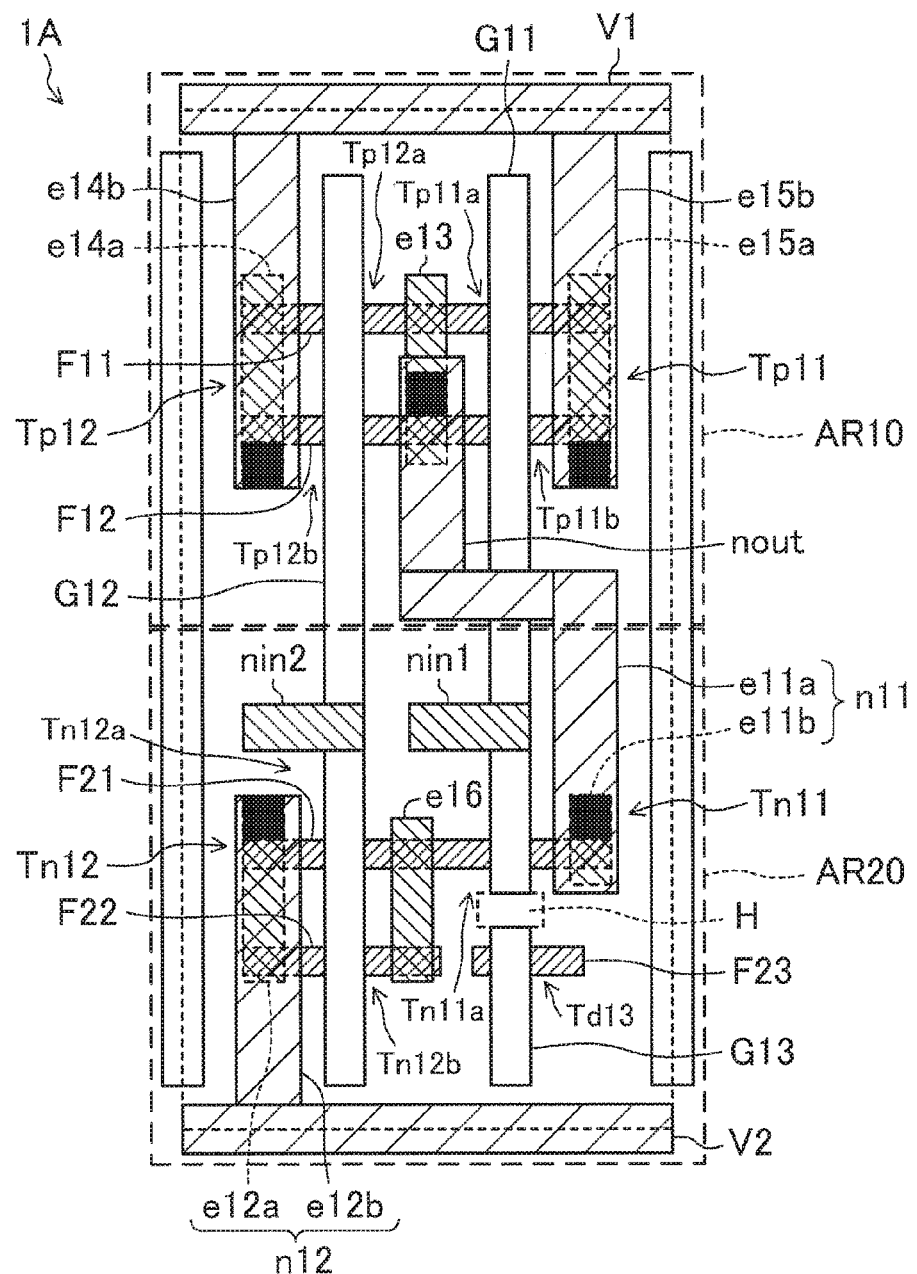
FIG. 2 conceptually illustrates an exemplary layout design for a logic circuit according to an embodiment.

FIG. 2 conceptually illustrates an exemplary layout design for a logic circuit 1A according to this embodiment.

In FIG. 2, a fin transistor is comprised of an active fin and a gate line formed on the active fin. A local interconnect is formed so as to be located on an active fin, a dummy fin, or a gate line in a region in which the local interconnect overlaps with the active fin, the dummy fin, or the gate line when viewed in plan, and is electrically connected to the active fin, the dummy fin, or the gate line. A metallic interconnect is located over the local interconnect, and is connected to the local interconnect through a contact. In FIG. 2, the active and dummy fins are hatched to allow the reader to find those fins (in FIG. 2, they are collectively called "fins") easily on the drawing. However, the fins are not hatched at their portion located under the gate line. The local interconnect and metallic interconnect are also hatched differently, and a portion at which the metallic interconnect and local interconnect are connected together through a contact is indicated by the solid square.

The logic circuit 1A includes a plurality of active fins F11, F12, F21, and F22 extending in the lateral direction on the paper (corresponding to a first direction) and arranged vertically downward on the paper (corresponding to a second direction perpendicular to the first direction). The active fin F22 has a shorter length in the lateral direction on the paper than the other active fins F11, F12, and F21. In the lateral direction on the paper, the left end of the active fin F22 is disposed at the same position in the lateral direction on the paper as those of the other active fins F11, F12, and F21. The logic circuit 1A further includes a dummy fin F23 extending in the lateral direction on the paper, and separately disposed laterally adjacent to, and on the right side of, the active fin F22 so as to be located at the same position in the vertical direction on the paper as this active fin F22. The dummy fin F23 is also disposed vertically adjacent to the active fin F21 on the paper. Note that when we say "fins or other elements are disposed at the same position," it means that they are disposed at substantially the same position and may have their positions slightly shifted from each other due to some error involved with the design or manufacturing process.

A gate line G11 extends in the vertical direction on the paper, and crosses the active fins F11 and F12 at right angles in respective regions closer to their right end in the lateral direction on the paper with respect to the lateral centerline of the active fins F11 and F12 on the paper. In this manner, two fin transistors Tp11a and Tp11b forming the p-channel transistor Tp11 are implemented. The gate line G11 also crosses the active fin F21 at right angles in a region closer to its right end in the lateral direction on the paper with respect to the lateral centerline of the active fin F21 on the paper. In this manner, a single fin transistor Tn11a forming the n-channel transistor Tn11 is implemented. The gate line G11 is connected to the input node nin1, and receives an input signal IN1 through this input node nin1.

A gate line G12 extends in the vertical direction on the paper, and is disposed laterally adjacent to, and on the left side of, the gate line G11. The gate line G12 crosses the active fins F11 and F12 at right angles in respective regions closer to their left end in the lateral direction on the paper with respect to lateral centerline of the active fins F11 and F12. In this manner, two fin transistors Tp12a and Tp12b forming the p-channel transistor Tp12 are implemented. The gate line G12 further crosses the active fin F21 at right angles in a region closer to its left end in the lateral direction on the paper with respect to the lateral centerline of the active fin F21 on the paper, and further crosses the active fin F22 at right angles at the lateral center of the active fin F22 on the paper. In this manner, two fin transistors Tn12a and Tn12b forming the n-channel transistor Tn12 are implemented. The gate line G12 is connected to the input node nin2 and receives an input signal IN2 through this input node nin2.

A gate line G13 functioning as a dummy gate extends in the vertical direction on the paper, and is separately disposed vertically adjacent to, and under, the gate line G11 on the paper so as to be disposed at the same position in the lateral direction on the paper as the gate line G11. The gate line C13 crosses the dummy fin F23 at right angles at the lateral center of the dummy fin F23 on the paper. In this manner, a dummy transistor Td3 having a fin structure is implemented. Note that the gate lines G11 and G13 may be formed separately. Alternatively, a single gate line may be formed so as to include both the gate lines G11 and G13, and then, a portion of the single gate line may be cut off (in the region H on the paper).

The output node nout which outputs an output signal OUT extends in the vertical direction on the paper from a vertical centerline of the plane on which the logic circuit 1A is drawn, and is connected to a connection line e13 through a contact. The connection line e13 is connected to the active fins F11 and F12 between the gate lines G11 and G12. The respective left ends of the active fins F11 and F12 on the paper are connected to a power supply line V1 through a connection line e14a extending in the vertical direction on the paper and another connection line e14b connected to the former connection line e14a through a contact and extending in the vertical direction on the paper. Likewise, the respective right ends of the active fins F11 and F12 on the paper are connected to the power supply line V1 through a connection line e15a extending in the vertical direction on the paper and another connection line e15b connected to the former connection line e15a through a contact and extending in the vertical direction on the paper. In this manner, the two p-channel transistors Tp11 and Tp12 connected together in parallel between the power supply line V1 and the output node nout are implemented. The p-channel transistors Tp11 and Tp12 are arranged in a p-conductivity-type region AR10.

The output node nout is further connected to a connection line e11a extending in the lateral direction on the paper from a lateral center of the plane on which the logic circuit 1A is drawn and then extending in the vertical direction on the paper, and is further connected to another connection line e11b connected to the former connection line e11a through a contact. The connection line e11b is connected to the right end of the active fin F21 on the paper. In FIG. 2, the node n11 is comprised of the connection lines e11a and e11b, i.e., the local and metallic interconnects. Alternatively, this node n11 may be comprised of only one of the local and metallic interconnects. The same applies to the node n12.

The active fins F21 and F22 are connected together between the gate lines G11 and G12 via a connection line e16 extending in the vertical direction on the paper. The respective left ends of the active fins F21 and F22 on the paper are connected to a ground line V2 via a connection line e12a extending in the vertical direction on the paper and another connection line e12b connected to the former connection line e12a through a contact and extending in the vertical direction on the paper. In this manner, two n-channel transistors Tn11 and Tn12 connected together in series are implemented between the output node nout and the ground line V2. The n-channel transistors Tn11 and Tn12 are arranged in an n-conductivity-type region AR20.

In this embodiment, the gate line G11 forming part of the n-channel transistor Tn11 is supposed to have the same length (the length in the lateral direction on the paper) as the gate line G12 forming part of the n-channel transistor Tn12. The active fins F21 and F22 are supposed to have the same width and the same height. Note that when we say "the gates or fins have the same length, width or height," it means that the gates or fins have substantially the same length, width or height, i.e., their lengths, widths or heights may be slightly different from each other due to some error involved with the manufacturing process.

As can be seen, in the driver circuit 10 of the logic circuit 1A, the fin transistors forming the two n-channel transistors Tn11 and Tn12 have the same gate length, the same fin width, and the same fin height. However, the number of the fin transistors forming one n-channel transistor Tn11 is different from that of the fin transistors forming the other n-channel transistor Tn12. In other words, these n-channel transistors Tn11 and Tn12 have different degrees of drivability. Specifically, the n-channel transistor Tn12 has a greater degree of drivability than the n-channel transistor Tn11 does. As can be seen, connecting together in series such transistors (e.g., the n-channel transistors Tn11 and Tn12) comprised of respectively different numbers of the fin transistors allows for setting the drivability greater than in a situation where two n-channel transistors Tn11 are connected together in series, and smaller than in a situation where two n-channel transistors Tn12 are connected together in series. That is to say, according to the embodiment, setting the number of fin transistors forming one of the two transistors connected together in series to be different from that of fin transistors forming the other transistor in the driver circuit allows for providing a driver circuit having a different degree of drivability from a situation where two transistors, each comprised of the same number of the fin transistors, are connected together in series. Thus, changing the number of the fin transistors forming one of the two transistors connected together in series allows for providing a driver circuit (semiconductor integrated circuit) with a desired degree of drivability. That is to say, the degree of flexibility in designing the circuit may be increased. Consequently, this allows for improving the performance of the driver circuit and a logic circuit including the driver circuit.

The logic circuit 1A shown in FIG. 2 may be implemented as a standard cell. A standard cell design which uses such a standard cell will now be described as a method of forming a semiconductor integrated circuit on a semiconductor substrate. The standard cell design refers to a method of designing a large-scale integrated circuit (LSI) chip by providing in advance, as standard cells, unit logic elements having particular logic functions (for example, an inverter, a latch, a flip-flop, and a full adder), laying out those standard cells on a semiconductor substrate, and connecting those standard cells together with metallic interconnects. In other words, implementation of the logic circuit according to this embodiment as a standard cell facilitates the design of a device including the standard cell, such as a semiconductor integrated circuit.

In FIG. 1, the driver circuit 10 is supposed to include the two n-channel transistors Tn11 and Tn12 connected together in series. The same or similar advantage may also be achieved even if three or more transistors, at least one of which is comprised of a different number of the fin transistors from the others of the transistors, are connected together in series.

Figure 3:
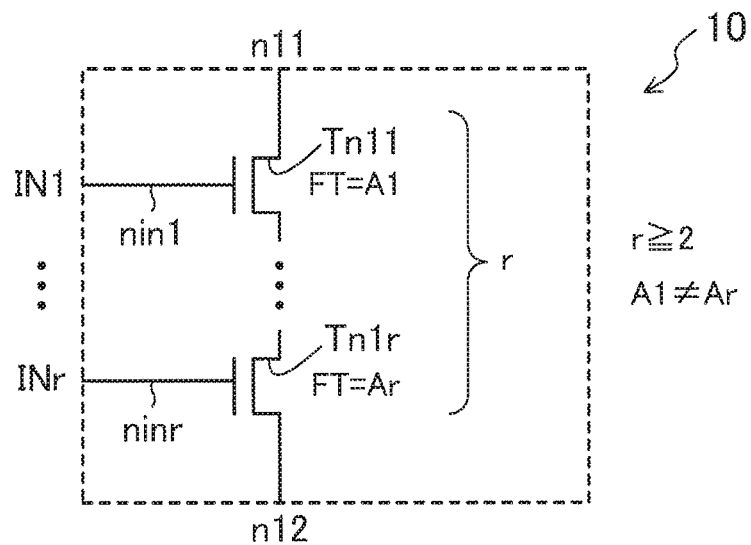
FIG. 3 schematically illustrates a configuration of a semiconductor integrated circuit.

FIG. 3 schematically illustrates the configuration of the driver circuit 10 according to this embodiment.

As illustrated in FIG. 3, the driver circuit 10 includes r n-channel transistors Tn11, . . . , and Tn1r (where r is an integer equal to or greater than two) connected together in series between the nodes n11 and n12. The n-channel transistors Tn11, . . . , and Tn1r may be comprised of respectively different numbers (A1, . . . , and Ar) of fin transistors. The gates of the n-channel transistors Tn11, . . . , and Tn1r are respectively connected to mutually different input nodes nin1, . . . , and ninr which receive different input signals IN1, . . . , and INr, respectively.

Setting, as appropriate, the number A1, . . . , or Ar of the fin transistors forming at least one of the n-channel transistors Tn11, . . . , and Tn1r to be different from that/those of the others of the n-channel transistors allows for providing a driver circuit 10 (semiconductor integrated circuit) with a desired degree of drivability. That is to say, the degree of flexibility in designing the circuit may be increased. Consequently, this allows for improving the performance of the driver circuit and a logic circuit including the driver circuit.

Note that in the driver circuit 10, not all of the r transistors connected together in series have to be comprised of respectively different numbers of fin transistors, but at least one of the r transistors needs to be comprised of a different number of fin transistors from the others of the r transistors. Specifically, the same or similar advantage may also be achieved even if at least one of the transistors connected together in series is comprised of a different number of fin transistors from the others of the transistors while the other transistors are each comprised of the same number of fin transistors as illustrated in FIG. 4, for example.

Figure 4:
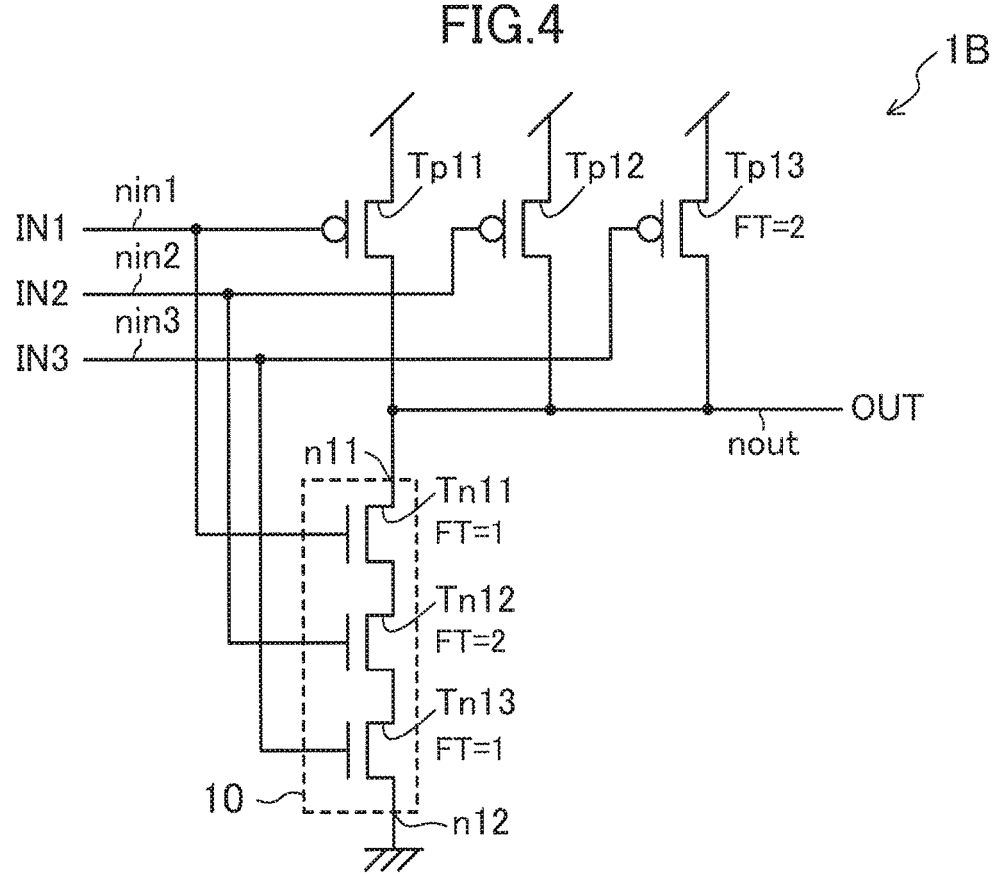
FIG. 4 conceptually illustrates another exemplary circuit configuration of a logic circuit according to an embodiment.

The logic circuit 1B illustrated in FIG. 4 is a three-input NAND circuit including the driver circuit 10, and three p-channel transistors Tp11, Tp12, and Tp13.

The driver circuit 10 includes, in addition to all of the elements illustrated in FIG. 1, an n-channel transistor Tn13 provided between the n-channel transistor Tn12 and the node n12. The n-channel transistor Tn13 is comprised of a single fin transistor, although its layout design is not illustrated. The fin transistors forming each of these three n-channel transistors Tn11, Tn12, and Tn13 are supposed to have the same gate length, and the same fin width and the same fin height. That is to say, the n-channel transistor Tn13 is supposed to have the same drivability as the n-channel transistor Tn11. The gate of the n-channel transistor Tn13 is connected to an input node nin3 and receives an input signal IN3 through this input node nin3.

Three p-channel transistors Tp11, Tp12, and Tp13 are provided in parallel with each other between a power supply and an output node nout. Each of the p-channel transistors Tp11, Tp12, and Tp13 is comprised of two fin transistors, although its layout design is not illustrated. The gates of the p-channel transistors Tp11, Tp12, and Tp13 are connected to the input nodes nin1, nin2, and nin3, respectively.

As can be seen, in the driver circuit of the logic circuit, setting the numbers of the fin transistors forming the transistors connected together in series such that at least one of the transistors is comprised of a different number of the fin transistors from the others of the transistors while the other transistors are each comprised of the same number of the fin transistors allows for providing a driver circuit having a different degree of drivability from a configuration in which transistors each comprised of the same number of fin transistors are connected together in series. Thus, as in FIG. 1, changing, as appropriate, the number of the fin transistors forming at least one of the transistors connected together in series allows for providing a driver circuit (semiconductor integrated circuit) with a desired degree of drivability. That is to say, the degree of flexibility in designing the circuit may be increased. Consequently, this allows for improving the performance of the driver circuit and a logic circuit including this driver circuit.

Other Embodiments

Some embodiments have been described as mere examples of the technique disclosed in the present application. However, the technique of the present disclosure is not limited thereto but is readily implementable as various other embodiments by making combinations, modifications, substitutions, additions, and/or omissions as appropriate on the embodiments described above.

For example, the driver circuit 10 is comprised of the n-channel transistors in FIGS. 1-4. However, the present disclosure is not limited thereto. The same or similar advantage may also be achieved even if the driver circuit is comprised of p-channel transistors as illustrated in FIG. 5, for example.

Figure 5:
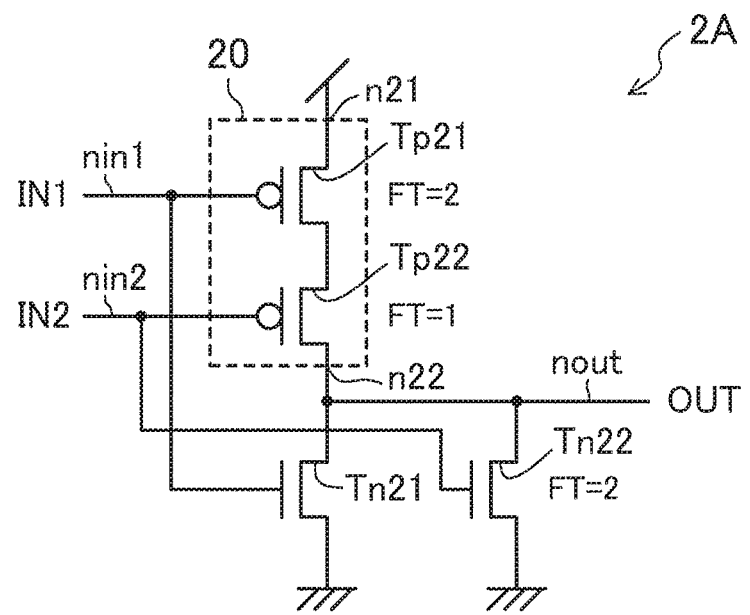
FIG. 5 conceptually illustrates yet another exemplary circuit configuration of a logic circuit according to an embodiment.
Figure 6:
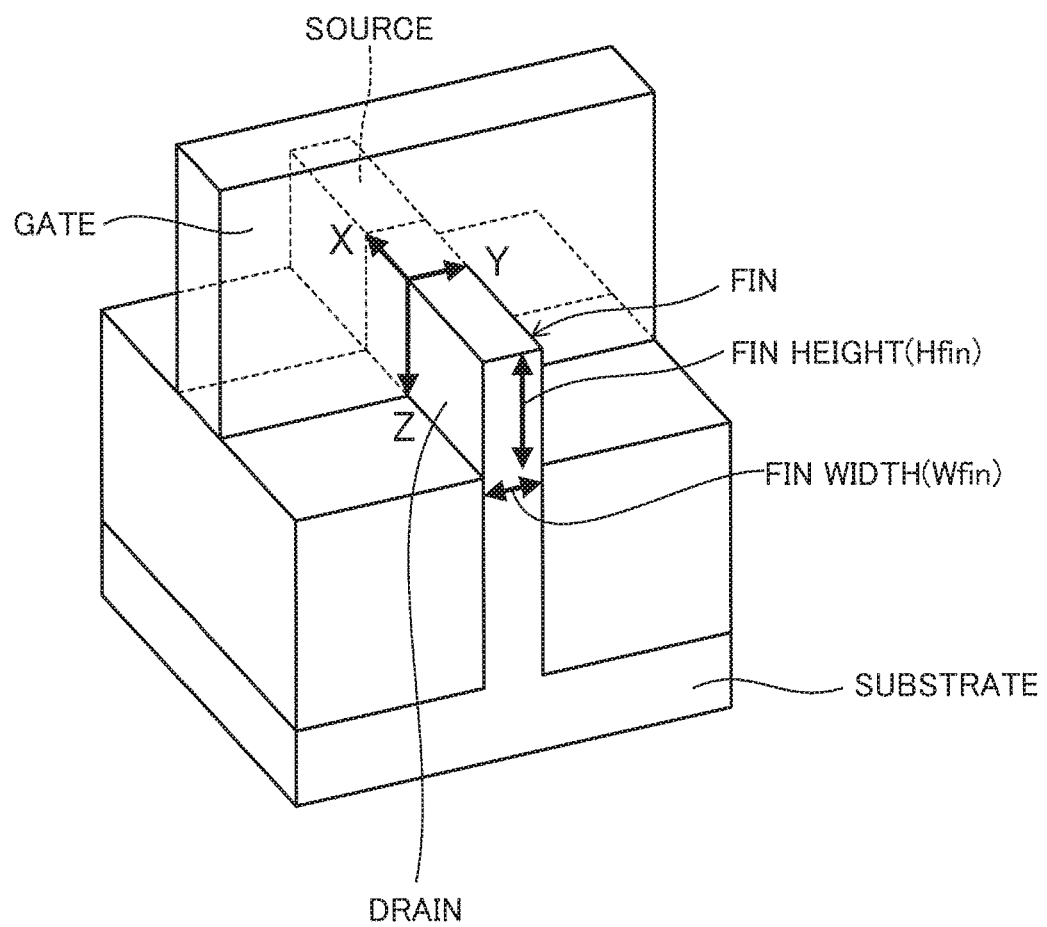
FIG. 6 illustrates the structure of a fin transistor.

The logic circuit 2A illustrated in FIG. 5 is a two-input NOR circuit including a driver circuit 20, and two n-channel transistors Tn21 and Tn22.

The driver circuit 20 includes p-channel transistors Tp21 and Tp22 (corresponding to second and first transistors and) connected together in series between a node n21 (corresponding to a first node and) connected to a power supply and a node n22 (corresponding to a second node and) connected to an output node nout. The gate of the p-channel transistor Tp21 is connected to an input node nin1. The gate of the p-channel transistor Tp22 is connected to an input node nin2. The p-channel transistor Tp21 is comprised of two fin transistors, and the p-channel transistor Tp22 is comprised of a single fin transistor, although their layout design is not illustrated. The fin transistors forming each of these two p-channel transistors Tp21 and Tp22 are supposed to have the same gate length, and the same fin width and the same fin height.

The two n-channel transistors Tn21 and Tn22 are connected together in parallel between the output node nout and the ground. Each of these n-channel transistors Tn21 and Tn22 is comprised of two fin transistors, although their layout design is not illustrated. The gates of the n-channel transistors Tn21 and Tn22 are connected to the input nodes nin1 and nin2, respectively.

As a result, the embodiment illustrated in FIG. 5 also allows, as in FIG. 1, for providing a driver circuit having a different degree of drivability from a driver circuit where transistors, each comprised of the same number of the fin transistors, are connected together in series. Thus, setting the number of the fin transistors forming at least one of the transistors connected together in series to be different from that/those of the others of the transistors allows for providing a driver circuit (semiconductor integrated circuit) with a desired degree of drivability.

In FIG. 3, the driver circuit 10 includes the n-channel transistors as transistors of the same conductivity type. Alternatively, providing p-channel transistors as the transistors of the same conductivity type for the driver circuit also allows for providing a driver circuit where two or more transistors are connected together in series based on the same or similar concept as in FIG. 3.

In the foregoing description, NAND and NOR circuits have been described with reference to FIGS. 1 and 5 as exemplary logic circuits. However, these are only exemplary embodiments of the logic circuit. For example, the driver circuit according to the present disclosure may also be applied to other fundamental gates, which include combinational logic and sequential circuits, such as AND, OR, Exclusive-OR (EOR), and Exclusive-NOR (ENOR) circuits, composite gates, and flip-flops. In that case, each of those fundamental gates may be implemented as a standard cell.

In FIG. 2, the two fin transistors Tn12a and Tn12b forming the n-channel transistor Tn12 are arranged in the vertical direction on the paper. However, this is only an exemplary embodiment of the present disclosure. Alternatively, those transistors Tn12a and Tn12b may also be arranged in the lateral direction on the paper, for example. Nevertheless, it is still recommended to arrange the two fin transistors Tn12a and Tn12b forming the n-channel transistor Tn12 in the vertical direction on the paper in order to reduce the area of the cell in the lateral direction on the paper and to facilitate the layout of metallic and/or local interconnects.

In FIG. 2, the logic circuit 1A includes the dummy fin F23 separately disposed laterally adjacent to, and on the right side of the active fin F22 so as to be disposed at the same position in the vertical direction on the paper as the active fin F22, and arranged vertically adjacent to the active fin F21 on the paper. However, this is only an exemplary embodiment of the present disclosure. For example, the position of the active fin F22 may be different from that of the dummy fin F23 in the vertical direction on the paper. The dummy fin F23 does not have to be arranged vertically adjacent to the active fin F21 on the paper. The same or similar advantage to the one achieved by the embodiment shown in FIG. 2 may also be achieved even if the dummy fin F23 is omitted. However, providing the dummy fin F23 imparts regularity to the fin structure, and eventually allows for reducing, e.g., an error involved with the manufacturing process. The dummy fin F23 does not have to be floating, but may be provided with a fixed potential. For example, the dummy fin F23 may be connected to the ground.

In FIG. 2, the logic circuit 1A includes the gate line G13 crossing the dummy fin F23 at right angles at a halfway point in the lateral direction on the paper, and the gate G13 is disposed vertically adjacent to (and separated from) the gate line G11 on the paper, i.e., functions as a floating gate. However, this is only an exemplary embodiment of the present disclosure. Alternatively, the gate lines G11 and G13 may be combined together. This allows for achieving the same or similar advantage as/to the one achieved in FIG. 1, and increasing the regularity of the gate structure. Optionally, the gate line G13 may be supplied with a fixed potential. Or the gate line G13 may even be omitted. However, providing the gate line G13 at the position illustrated in FIG. 2 imparts regularity to the gate structure compared to the circuit without the gate line G13, and eventually allows for reducing, e.g., an error involved with the manufacturing process.

The present disclosure is capable of, while designing a semiconductor integrated circuit, controlling its drivability. Therefore, the present disclosure is useful for circuits which require control of their drivability, and may be used effectively in, e.g., logic circuits including fundamental gates such as NAND circuits and OR circuits, and semiconductor integrated circuits including such logic circuits.

What is claimed is:

1. A semiconductor integrated circuit connected to first and second input nodes and first and second nodes, the circuit comprising
   first and second transistors of a first channel type connected together in series between the first and second nodes, wherein
   the first transistor is comprised of n fin transistor(s) where n is an integer equal to or greater than one, the n fin transistor(s) having an identical gate length and an identical gate width, the first transistor having its gate connected to the first input node, and
   the second transistor is comprised of m fin transistors where m is an integer greater than n, the m fin transistors having the same gate length and the same gate width as the n fin transistor(s), the second transistor having its gate connected to the second input node.

2. The semiconductor integrated circuit of claim 1, wherein
   the semiconductor integrated circuit is further connected to a third input node,
   the semiconductor integrated circuit further includes a third transistor of the first channel type connected in series to the first and second transistors between the first and second nodes, and
   the third transistor is comprised of l fin transistor(s) where l is an integer equal to or greater than one, the l fin transistor(s) having the same gate length and the same gate width as the n fin transistor(s), the third transistor having its gate connected to the third input node.

3. The semiconductor integrated circuit of claim 1, wherein
   the fin transistors forming the second transistor include respective fins extending in a first direction, and
   the fins are arranged in a second direction perpendicular to the first direction.

4. The semiconductor integrated circuit of claim 3, wherein
   the fin transistor(s) forming the first transistor include(s) respective fin(s) extending in the first direction, and
   the semiconductor integrated circuit includes a dummy fin arranged in the second direction adjacent to at least one fin forming part of the first transistor.

5. The semiconductor integrated circuit of claim 4, wherein
   the dummy fin and at least one of the fins forming parts of the second transistor are arranged in a straight line extending in the first direction, and are separated from each other.

6. The semiconductor integrated circuit of claim 4, further comprising
   a dummy gate extending in the second direction and arranged to cross the dummy fin at right angles.

7. The semiconductor integrated circuit of claim 6, wherein
   the dummy gate is configured as a floating gate.

8. The semiconductor integrated circuit of claim 6, further comprising
   a first gate extending in the second direction and arranged to cross, at right angles, at least one fin forming part of the first transistor, wherein
   the dummy gate and the first gate are arranged in a straight line extending in the second direction, and are electrically connected together.

9. The semiconductor integrated circuit of claim 8, wherein
   the dummy gate and the first gate are combined together.

10. A logic circuit comprising a plurality of semiconductor integrated circuits, wherein
    the plurality of semiconductor integrated circuits include a first semiconductor integrated circuit configured as the semiconductor integrated circuit of claim 1.

11. The logic circuit of claim 10, wherein
    the logic circuit is configured as a standard cell including the first semiconductor integrated circuit.

12. The logic circuit of claim 10, wherein
    the plurality of the semiconductor integrated circuits form a fundamental gate.

* * * * *